US009793083B2

(12) United States Patent
Hyde et al.

(10) Patent No.: US 9,793,083 B2
(45) Date of Patent: Oct. 17, 2017

(54) MICROSTRUCTURED SURFACE WITH LOW WORK FUNCTION

(71) Applicant: Elwha LLC, Bellevue, WA (US)

(72) Inventors: Roderick A. Hyde, Redmond, WA (US); Jordin T. Kare, San Jose, CA (US); Tony S. Pan, Bellevue, WA (US); Lowell L. Wood, Jr., Bellevue, WA (US)

(73) Assignee: Elwha LLC, Bellevue, WA (US)

( * ) Notice: Subject to any disclaimer, the term of this patent is extended or adjusted under 35 U.S.C. 154(b) by 0 days.

(21) Appl. No.: 15/396,701

(22) Filed: Jan. 2, 2017

(65) Prior Publication Data

US 2017/0221667 A1 Aug. 3, 2017

Related U.S. Application Data

(63) Continuation of application No. 15/013,699, filed on Feb. 2, 2016, now Pat. No. 9,536,696.

(51) Int. Cl.

| | |
|---|---|
| ***H01L 29/06*** | (2006.01) |
| ***H01J 19/24*** | (2006.01) |
| ***H01J 9/02*** | (2006.01) |
| ***H01J 9/18*** | (2006.01) |

(52) U.S. Cl.

CPC .............. *H01J 19/24* (2013.01); *H01J 9/025* (2013.01); *H01J 9/18* (2013.01); *H01J 2209/0223* (2013.01)

(58) Field of Classification Search

CPC ........... H01J 1/304; H01J 1/3045; H01J 1/308

See application file for complete search history.

(56) References Cited

U.S. PATENT DOCUMENTS

| | | | |
|---|---|---|---|
| 5,266,155 | A | 11/1993 | Gray |
| 5,502,348 | A | 3/1996 | Moyer et al. |
| 5,691,600 | A | 11/1997 | Moyer et al. |
| 5,713,775 | A | 2/1998 | Geis et al. |
| 5,861,707 | A | 1/1999 | Kumar |
| 6,384,519 | B1 | 5/2002 | Beetz et al. |
| 7,521,851 | B2 | 4/2009 | Tolt |
| 8,575,842 | B2 | 11/2013 | Hyde et al. |
| 2003/0049899 | A1 | 3/2003 | Syms |
| 2004/0183421 | A1 * | 9/2004 | Nakamoto ............. B82Y 10/00 313/309 |
| 2005/0168131 | A1 | 8/2005 | DiSanto et al. |
| 2006/0290291 | A1 | 12/2006 | Aizawa |
| 2008/0191189 | A1 | 8/2008 | Kastalsky |
| 2009/0224679 | A1 | 9/2009 | Pan et al. |
| 2015/0240797 | A1 | 8/2015 | Tin |

* cited by examiner

*Primary Examiner* — Yosef Gebreyesus

(74) *Attorney, Agent, or Firm* — Foley & Lardner LLP

(57) ABSTRACT

A horizontal multilayer junction-edge field emitter includes a plurality of vertically-stacked multilayer structures separated by isolation layers. Each multilayer structure is configured to produce a 2-dimensional electron gas at a junction between two layers within the structure. The emitter also includes an exposed surface intersecting the 2-dimensional electron gas of each of the plurality of vertically-stacked multilayer structures to form a plurality of effectively one-dimensional horizontal line sources of electron emission.

25 Claims, 5 Drawing Sheets

MICROSTRUCTURED SURFACE WITH LOW WORK FUNCTION

CROSS-REFERENCE TO RELATED APPLICATIONS

The present application is a continuation of application Ser. No. 15/013,699, filed Feb. 2, 2016, which is incorporated herein by reference in its entirety.

BACKGROUND

In solid-state physics, the work function defines the minimum energy required to remove an electron from a solid to a point immediately outside the surface of the solid. In other words, the work function is the amount of energy needed to move the electron from the highest filled Fermi level into the vacuum immediately outside the solid surface. This amount of energy is typically measured in electron volts, and as opposed to being a property of a bulk material itself, the work function is a characteristic property for a surface of the material.

SUMMARY

One embodiment relates to a horizontal multilayer junction-edge field emitter (HMJFE). The HMJFE includes a plurality of vertically-stacked multilayer structures, separated by isolation layers, each structure being configured to produce a 2-dimensional electron gas (2DEG) at a junction between two layers within the structure. The HMJFE includes an exposed surface intersecting the 2DEG of each of the plurality of vertically-stacked multilayer structures to form a plurality of effectively one-dimensional horizontal line sources of electron emission.

Another embodiment relates to a HMJFE. The HMJFE includes a first substrate including a first surface. The HMJFE includes a first plurality of vertically-stacked multilayer structures. The first plurality of vertically-stacked multilayer structures are separated by isolation layers, configured to produce a first 2DEG at a junction between two layers within the structure, and attached to the first surface. The HMJFE includes a second plurality of vertically-stacked multilayer structures. The second plurality of vertically-stacked multilayer structures are separated by isolation layers, configured to produce a second 2DEG at a junction between two layers within the structure, and attached to the first surface. The HMJFE includes a first anode attached to the first surface of the first substrate and configured to collect electrons emitted by the first 2DEG.

Another embodiment relates to a method of fabricating a HMJFE. The method includes disposing a first multilayer structure on a first substrate including a first surface, the first multilayer structure being configured to produce a first 2DEG at a junction between two layers within the first multilayer structure. The method includes disposing a first isolation layer on the first multilayer structure. The method includes disposing a second multilayer structure on the first isolation layer, the second multilayer structure configured to produce a second 2DEG at a junction between two layers within the second multilayer structure. The method includes disposing a first anode on the first surface of the first substrate, the first anode configured to collect electrons emitted by the first 2DEG.

Another embodiment relates to a vertical-emitting junction-edge field emitter structure (VEJFE). The VEJFE includes a plurality of vertical structures formed on a substrate, each vertical structure including at least two vertically oriented layers. Each vertical structure is configured to produce a 2DEG at a junction between two vertically-oriented layers of the vertical structure. Each vertical structure is truncated to expose an edge of the 2DEG.

Another embodiment relates to a method of fabricating a VEFJE structure. The method includes forming a plurality of vertical structures on a substrate, wherein forming each vertical structure includes positioning at least two vertically oriented layers adjacent to one another to create a junction between the two vertically oriented layers. The method includes truncating the plurality of vertical structures on an opposite side of the plurality of vertical structures from the substrate to expose an edge of the junction, the junction configured to produce a 2DEG.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1A:
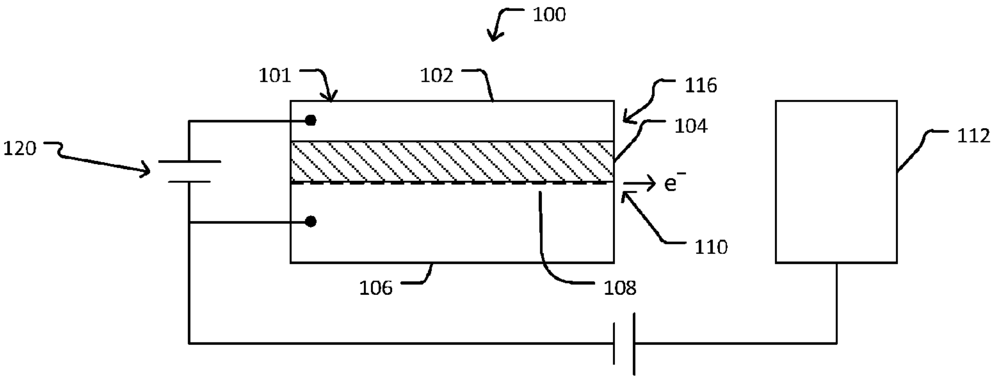
FIGS. 1A-1B are block diagrams of various HMJFE structures, according to various embodiments.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the scope of the subject matter presented here.

Referring generally to the figures, various embodiments for microstructured surfaces having low work functions are shown and described. As discussed by Srisonphan, Jung, and Kim in their article, *Metal-oxide-semiconductor field-effect transistor with a vacuum channel,* Nature Nanotechnology, vol. 7, 504-508 (2012), electrons can be emitted from the 1-dimensional edge of a 2-dimensional electron gas with a low work function. For example, electrons may be emitted from an edge formed by the interfacial layer of an oxide or metal on a semiconductor. According to the disclosure herein, such emission may be achieved over a wide area by microstructuring the interfacial layer so that there are many edges in order to provide multiple emissions. As an example, lithographic masking techniques may be used when forming such an interface to create interfacial dots, holes, or lines at the surface to provide multiple electron emissions with low work functions.

Referring to FIG. 1A, a block diagram of a single horizontal multilayer junction-edge emitter structure 100 is shown, according to one embodiment. The structure 100 generally includes an emitting structure 101 comprised of multiple thin layers of various materials. These materials may include n- or p-type doped semiconductors, undoped (intrinsic) semiconductors, insulators such as silicon dioxide or silicon nitride, and metallic conductors. For example, in an embodiment, the structure 101 includes an n-type semiconductor layer 102, an insulator layer 104, and a p-type semiconductor layer 106. In other embodiments, the structure includes the n-type semiconductor layer 102 in direct contact with the p-type semiconductor layer 106. In another embodiment, the structure 101 includes the n-type semiconductor layer 102, an intrinsic (undoped) semiconductor layer 104, and a metal (e.g., aluminum) layer 106. In some embodiments, a two-dimensional electron gas (2DEG) 108 can form at a junction (e.g., interfacial layer) between an oxide or metal on a semiconductor, or between two different semiconductors. For example, the 2DEG 108 can be formed at a junction of an n-type semiconductor 102 and an intrinsic semiconductor layer 104 or a junction between the p-type semiconductor 106 and the insulating layer 104 in the structure 100.

In some embodiments, at least two of the non-insulating layers may be biased relative to each other by an external voltage source 120, forming either a biased junction or a field effect device. In some embodiments, one or more layers may be atomically thin, e.g., a layer of graphene or molybdenum disulfide. In some embodiments, the 2DEG is confined to such an atomically thin layer. In other embodiments, a 2DEG may be formed between two layers comprising different insulators (e.g., ZnO/ZnMgO); in such embodiments, an electrical contact or tunnel junction may be provided to introduce electrons into, or remove electrons from, the 2DEG. Other configurations, without limitation, may be used to create a 2DEG.

The emitting structure 101 is truncated at surface 116, exposing an effectively one-dimensional edge 110 of the generally planar 2DEG 108. Such an exposed edge 110 of a 2DEG can emit electrons with a low work function compared to emission of electrons from a conventional material surface.

In some embodiments, structure 100 further includes an anode 112 spaced from the surface 116 and configured to capture electrons emitted from one-dimensional edge 110. The anode 112 may be configured to be a constant distance from at least a portion of edge 110, such that the electric field near edge 110 is uniform along edge 110. The anode 112 may be biased relative to the 2DEG to increase or decrease field emission of electrons from the one-dimensional edge 110.

In some embodiments, structure 100 may further include one or more grids located between the edge 110 and the anode 112. These grids may be biased to alter the electric field distribution between edge 110 and anode 112, and thereby control the rate and trajectory of electrons emitted from edge 110.

Figure 1B:
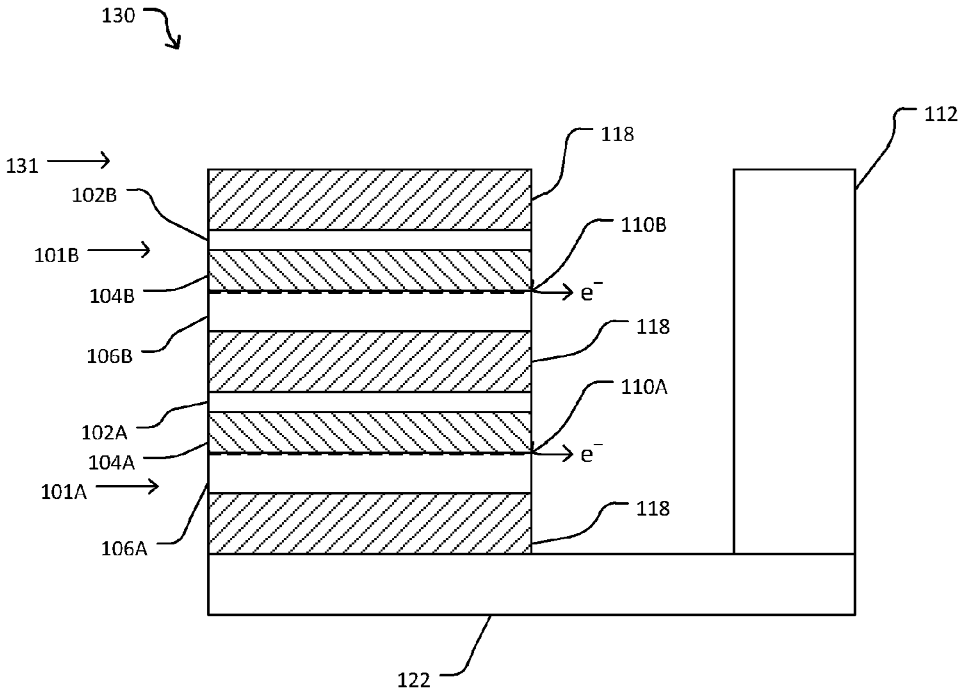

Now referring to FIG. 1B, a block diagram of a horizontal junction multilevel structure 130 is shown. The structure 130 includes a multilevel emitter structure 131, comprised of two or more individual emitter structures (100A, 100B) separated by isolation layers 118. In some embodiments, isolation layers 118 may be single layers of insulator (e.g., silicon dioxide, silicon nitride); however, other materials or structures (e.g., multilayers) may be included in layer 118, e.g. a grounded conductive layer to limit electric field interactions between levels. In some embodiments, the multilevel emitter structure 131 is deposited on a substrate 122. In some embodiments, individual emitter structures 101A, 101B may be biased by separate external voltage sources; in other embodiments, appropriate layers (e.g., 102A and 102B, 106A and 106B) may be electrically connected, such that multiple layers of emitter structure 130 can be biased by a single external voltage source.

Similarly to FIG. 1A, the multilevel emitter structure 131 terminates at a surface 116, exposing multiple one-dimensional edges 110A, 110B of 2DEGs formed in structures 110A, 110B; each such edge is an independent source of electron emission.

In some embodiments, the surface 116 may be formed by depositing materials forming multilevel emitter structure 131 over a limited area of substrate 122, e.g., by deposition through a mask. In other embodiments, the surface 116 may be formed by depositing the materials forming emitter structure 131 over a larger area of substrate 122, and then removing material, e.g. by an etching or milling process, to expose surface 116. For example, a vertically-sided trench in a multilayer-coated area may be formed via focused ion beam milling (e.g., a trench or channel having a cross-section of $0.25\times0.25\ \mu m^2$, $0.5\times0.5\ \mu m^2$, $1\times1\ \mu m^2$, etc.).

The surface 116 may be straight or curved as viewed perpendicular to the substrate, and in some embodiments may form one or both walls of one or more channels or trenches through the deposited layers 102-106. In other embodiments the surface 116 may form the inner wall of cylindrical or conical holes in layers 102-106, or the outer wall of cylindrical or conical posts, or other geometric configurations.

A common anode 112 may be used to collect electrons emitted from edges 110A and 110B. In some embodiments a common voltage may be present between the anode 112 and all emitting structures 101A, 101B, etc.; in other embodiments the voltages between the anode 112 and each emitting structure may be separately regulated. In such embodiments, the separate voltage regulation may be used to maintain a desired current or current density from each emitting structure despite variation in separation between the emitting structures and the anode 112; e.g., due to tilting of or irregularities in surface 116 or the surface of anode 112.

In some embodiments, one or more grids may be located between the emitting structure 131 and anode 112.

Figure 2A:
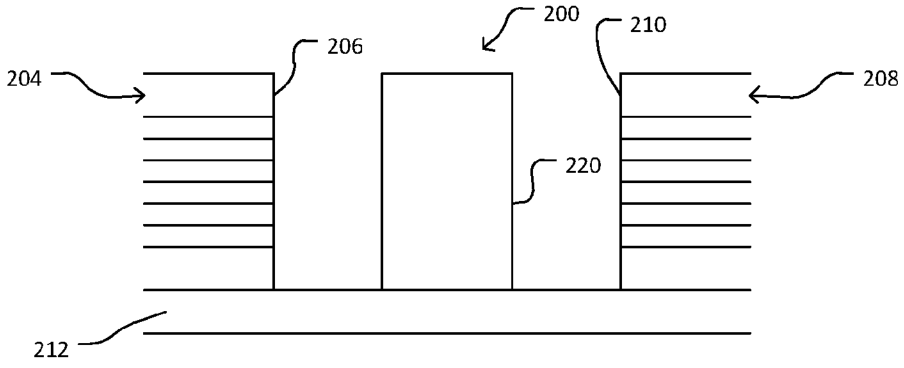
FIGS. 2A-2C are schematic diagrams of various HMJFE structures, according to various embodiments.
Figure 2B:
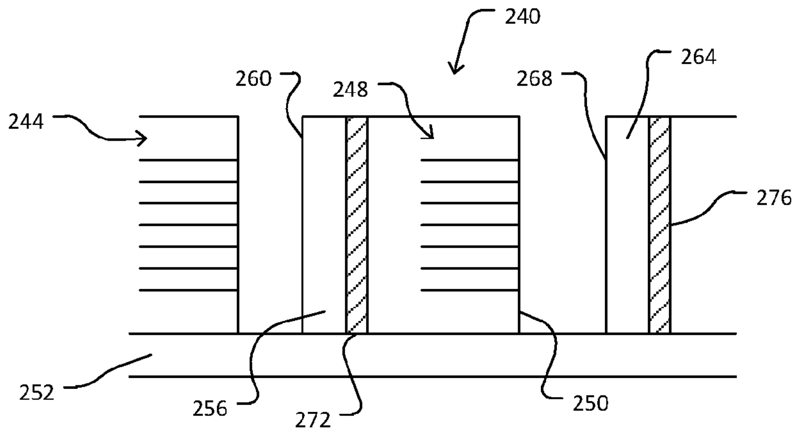
Figure 2C:
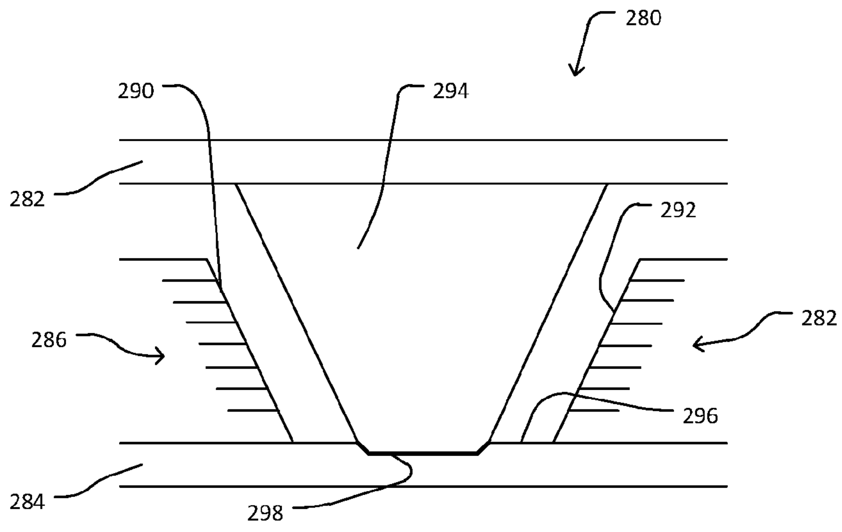

Now referring to FIGS. 2A-2C, various embodiments of arrangements of multilayer structures are shown. The multilayer structures may be similar to and may include features of the structure 100 illustrated in FIG. 1A and/or the structure 130 illustrated in FIG. 1B. Arranging multilayer structures in relationship to one another and/or in relationship to anodes may facilitate controlling the trajectories of electron emission and for controlling collection of emitted electrons. Such arrangements may be repeated to provide a plurality of multilayer emitters and anodes.

As shown in FIG. 2A, structure 200 includes multilayer emitters 204, 208 provided on substrate 212. Multilayer emitters 204, 208 include junctions (e.g., interfacial layers) at which a 2DEG can form. In some embodiments, multilayer emitters 204, 208 are formed by being separately deposited over a limited area of substrate 212, e.g., by deposition through a mask. In some embodiments, multilayer emitters 204, 208 are initially formed by depositing materials over a larger surface area of substrate 212, and then formed by removing material, e.g. by an etching or milling process, to expose surface 206 of multilayer emitter 204 and to expose surface 210 of multilayer emitter 208. For example, a symmetric trench may be formed between multilayer emitters 204, 208 by removing material.

Structure 200 includes anode 216 provided on substrate 212. In some embodiments, anode 216 is provided on substrate 212. For example, anode 216 may be provided on substrate 212, after which multilayer emitters 204, 208 are deposited on substrate 212 (e.g., by deposition through a mask); anode 216 may also be deposited on substrate 212 after material has been removed to form multilayer emitters 204, 208 and expose surfaces 206, 210.

As shown in FIG. 2A, anode 216 includes surface 218 configured to capture electrons emitted from one-dimensional edges of 2DEGs formed along surface 206 of multilayer emitter 204, and surface 220 configured to capture electrons emitted from one-dimensional edges of 2DEGs formed along surface 210 of multilayer emitter 208. Surfaces 218, 220 may be configured to be parallel to (e.g., at a constant distance from) at least a portion of surfaces 206, 210, respectively. In some embodiments, the anode 216 may be biased to increase or decrease field emission of electrons from the one-dimensional edges. In some embodiments, the distances between the surface 206 and the surface 218, and between the surface 210 and the surface 220, and/or the relative biases of the surfaces 218, 220, may be controlled or adjusted to manage field emission of electrons from the one-dimensional edges. In some embodiments, the etching/milling processes used to form the multilayer emitters 204, 208 are controlled based on an expected or known bias of the anode 216 in order to set the field emission of electrons from the one-dimensional edges of the multilayer emitters 204, 208, such as to determine the distance between the surfaces 206 and 218, the distance between the surfaces 210 and 220, the orientation of the surface 206 relative to the surface 218, and/or the orientation of the surface 210 relative to the surface 210.

As shown in FIG. 2B, structure 240 includes multilayer emitters 244, 248 provided on substrate 252. Multilayer emitters 244, 248 may be formed in a similar manner and may include similar features as multilayer emitters 204, 208 shown in FIG. 2A. As shown in FIG. 2B, multilayer emitter 244 includes a first surface 246 from which electrons can be emitted towards anode 256. Anode surface 260 of anode 256 is positioned to face first surface 246 of multilayer emitter 244. Multilayer emitter 248 includes a second surface 250 from which electrons can be emitted towards anode 264. Anode surface 268 of anode 264 is positioned to face second surface 250 of multilayer emitter 248. Multilayer emitter 248 includes a third surface 264, adjacent to which an insulator 272 is positioned. The insulator 272 is also positioned adjacent to the anode 260, thus insulating the multilayer emitter 248 from the anode 260, facilitating electron flow from the multilayer emitter 248 to the anode 264. An insulator 276 is also positioned adjacent to the anode 264 and on an opposite side of the anode 264 from the anode surface 268. A plurality of such structures combining anodes, insulators, and multilayer emitters may be provided along substrate 252. For example, an insulator (not shown) may be positioned adjacent to an opposite side of the multilayer emitter 244 from the first surface 246, and a multilayer emitter (not shown) may be positioned adjacent to the insulator 276 on an opposite side of the insulator 276 from the anode 264.

As shown in FIG. 2C, structure 280 includes a first substrate 282 and a second substrate 284 spaced from the first substrate 282. The first substrate 282 may be parallel to the second substrate 284. A first multilayer emitter 286 and a second multilayer emitter 288 are disposed on a surface 296 of the second substrate 284 that faces the first substrate 282. As shown in FIG. 2C, the multilayer emitters 286, 288 do not contact the first substrate 282. The multilayer emitters 286, 288 are spaced apart from one another along the surface 296 of the substrate 284 such that a trench is formed between the substrates 282, 284 and the multilayer emitters 286, 288. Electrons emitted from 2DEGs of multilayer emitters 286, 288 may be emitted from surfaces 290, 292 of multilayer emitters 286, 288. In some embodiments, surface 290 and/or surface 292 are formed to be oblique to the surface 296 of the substrate 284. In some embodiments, surface 290 and/or surface 292 are formed to be perpendicular to the surface 296 of the substrate 284.

As shown in FIG. 2C, an anode 294 is provided in the trench formed in the structure 280. Surfaces of the anode 294 are positioned to face the surfaces 290, 292 in order to collect emitted electrons. One or more alignment features, such as groove 298, may be provided on substrate 284 and/or anode 294 to aid in positioning anode 294 relative to emitting surfaces 290, 292.

Figure 3:
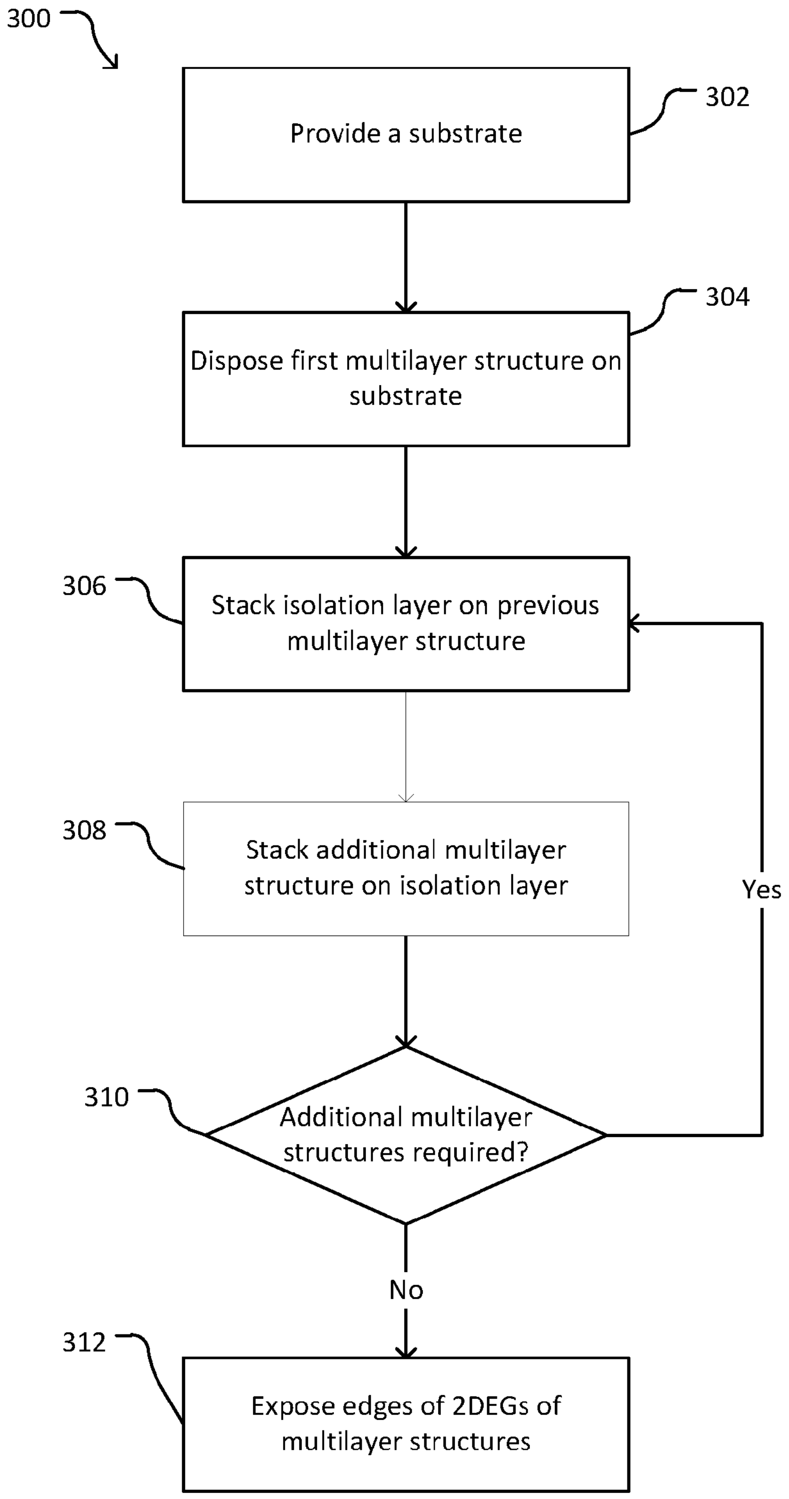
FIG. 3 is a flowchart of a process for creating a HMJFE structure, according to one embodiment.

Now referring to FIG. 3, a flow diagram of a process 300 for fabricating a HMJFE structure is shown, according to one embodiment. The process 300 may include use of the components and materials discussed herein in regards to FIGS. 1A-2C. In alternative embodiments, fewer, additional, and/or different actions may be performed. Also, the use of a flow diagram is not meant to be limiting with respect to the order of actions performed. At 302, a substrate is provided. At 304, a first multilayer structure (e.g., a multi-level emitter structure) is disposed (e.g., stacked, attached, etc.) on the substrate. The first multilayer structure may include a plurality of layers, such as conducting layers, semiconductor layers, and/or insulator layers. The multilayer structure may be deposited on the substrate in layers. A 2DEG can form at a junction between layers of the multilayer structure. At 306, an isolation layer is stacked on the previous multilayer structure (e.g., stacked on the first multilayer structure), such as by deposition. At 308, an additional multilayer structure is stacked on the isolation layer, such as by deposition. At 310, it is determined if additional multilayer structures are required. If additional multilayer structures are required, then steps 306-308 may be repeated as necessary. Additional multilayer structures may also be disposed on the substrate instead of stacking on the existing multilayer structures.

If additional multilayer structures are not required, then at 312, edges of 2DEGs of the HMJFE structure are exposed. In some embodiments, material is removed from the HMJFE, such as by an etching or milling process, to expose the edges. In some embodiments, the multi-layer structures were deposited through a mask over a limited area of the substrate. In various embodiments, the order of providing multilayer structures or layers thereof, along with exposing edges of 2DEGs of the HMJFE structure, may be modified as desired.

Figure 4:
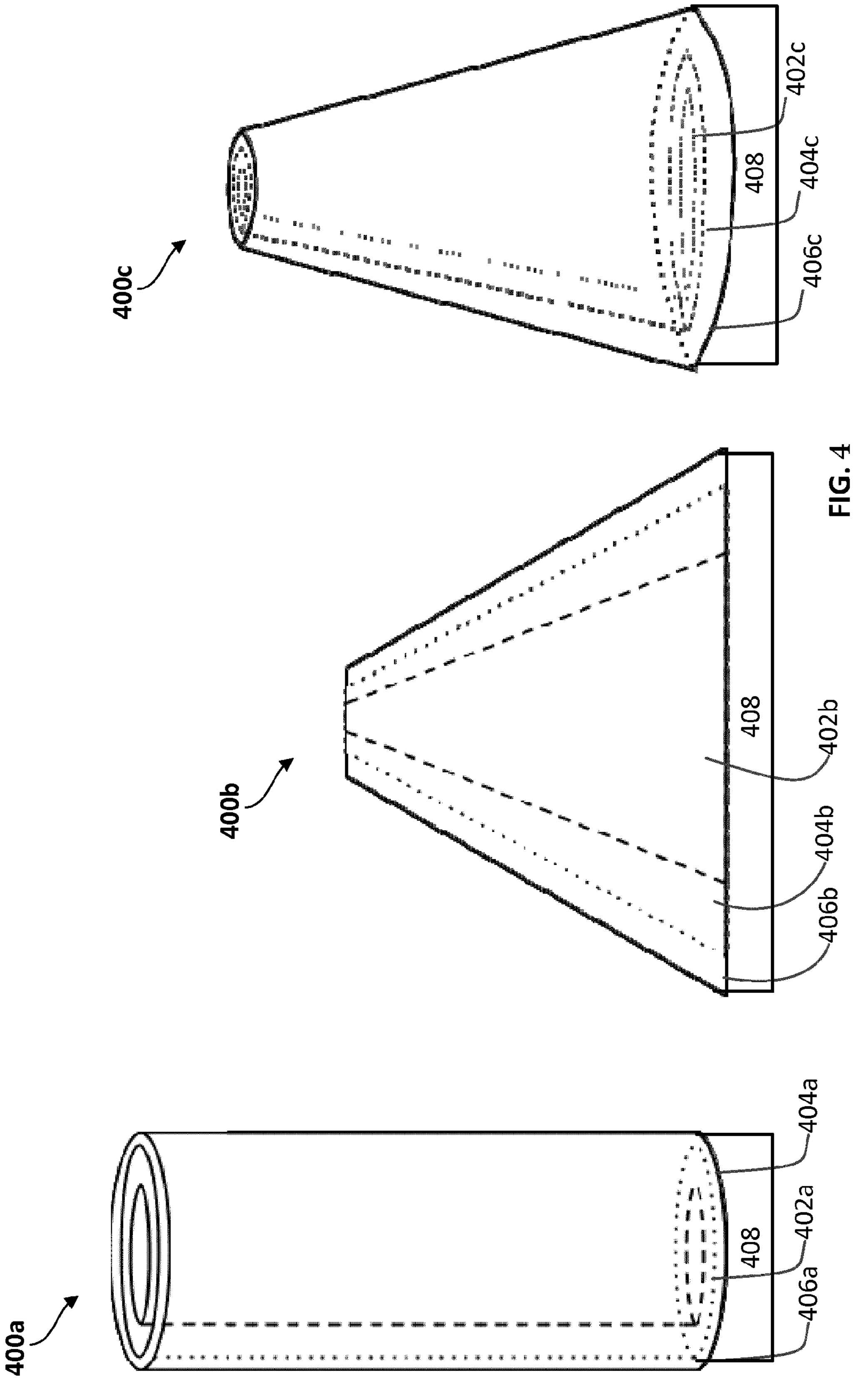
FIG. 4 is a schematic diagram of a VEJFE structure, according to one embodiment.

Vertical-emitting structures (e.g., structures emitting electrons in a direction perpendicular to a substrate) having a low work function may also be formed. Referring to FIG. 4, VEJFE structures (400*a*, 400*b*, and 400*c*) are shown, according to various embodiments. Each of structures 400*a*, 400*b*, and 400*c* includes a vertical structure (i.e., a structure extending upward from substrate 408) comprised of core 402 which supports one or more vertically-oriented layers, e.g., layers 404, 406. At least one junction between layers is configured to support a 2DEG, similar to the 2DEG 108 at a junction between horizontal layers shown in FIG. 1A. For example, the vertically-oriented layers may include various combinations of conducting layers, semi-conductor layers, and/or insulating layers disposed adjacent to one another.

Structures 400*a*, 400*b*, and 400*c* may be deposited on a substrate 408. The substrate 408 may be similar to the substrates 122, 212, 252, 282, or 284 discussed above with respect to FIGS. 1A-2C. Each of structures 400*a*, 400*b*, and 400*c* may include an anode or a grid. The anode can capture electrons emitted from the various exposed emitting edges of each of the structures 400*a*, 400*b*, and 400*c*. The grid can control emission of the electrons from the various exposed emitting edges of each of the structures 400*a*, 400*b*, and 400*c*.

In some embodiments, the anode or grid is provided as a conducting layer which is exposed near the exposed emitting edges of the structures 400*a*, 400*b*, 400*c*. For example, a grid may extend to the truncated end of the vertical structure and be exposed by truncation in the same plane as the exposed emitted edge. Differential etching may also be used to expose the grid at a greater distance from the substrate 408 (e.g., further “above” the substrate 408) than the exposed emitting edge. The grid may be provided on the outside of one or more of the structures 400*a*, 400*b*, and 400*c*, and may act as a gate for electron emission. In some embodiments, the anode or grid is connected through a biasing layer in the substrate 408 that allows for biasing the anode or grid.

In one embodiment, structure 400*a* is a cylindrical structure including doped semiconductor 402*a*. In another embodiment, structure 400*b* is a pyramid-shaped structure including doped semiconductor 402*b*. In another embodiment, structure 400*c* is a conical structure including doped semiconductor 402*c*. An insulating layer can be deposited over the doped semiconductor layer. For example, insulators 404*a*, 404*b*, and 404*c*, may each be formed over doped semiconductors 402*a*, 402*b*, and 402*c*, respectively. A conducting layer may then be deposited over at least part of the insulating layer. For example, conductors 406*a*, 406*b*, and 406*c*, may each be formed at least partially over insulators 404*a*, 404*b*, and 404*c*, respectively. In various embodiments, the selection of doped semiconductor layers, conducting layers, and/or insulator layers may be interchanged for each of the structures 400*a*, 400*b*, 400*c*. In some embodiments, one or more of the vertical structures are provided in a ridge shape (e.g., having a cross-section similar to structure 400*b* but extending in a direction normal to the plane of FIG. 4).

In order to form effectively 1-dimensional electron emitters, the tops of the vertical structures (e.g., 400*a*, 400*b*, and 400*c*) may be exposed. For example, the tops of structures 400*a*, 400*b*, and 400*c* may be polished, ground, or otherwise machined to expose the edges of the doped semiconductor/insulator junctions within the structures. As a result, and depending on the shape of base structure (e.g., cylinder, pyramid, cone, etc.), a circular, linear, oval, etc., shaped emitting area with a low work function can be formed on the top of the vertical structure. A plurality of vertical structures (e.g., structures 400*a-c*) may then be arranged in an array. In some embodiments, an anode or electrode grid is arranged over the tops of the vertical structures. The grid can control the emission of electrons from the exposed edges of the doped semiconductor/insulator junctions of the structures. The anodes can capture and, in some embodiments, control the emission of electrons from the exposed edges of the doped semiconductor/insulator junctions of the structures.

Figure 5:
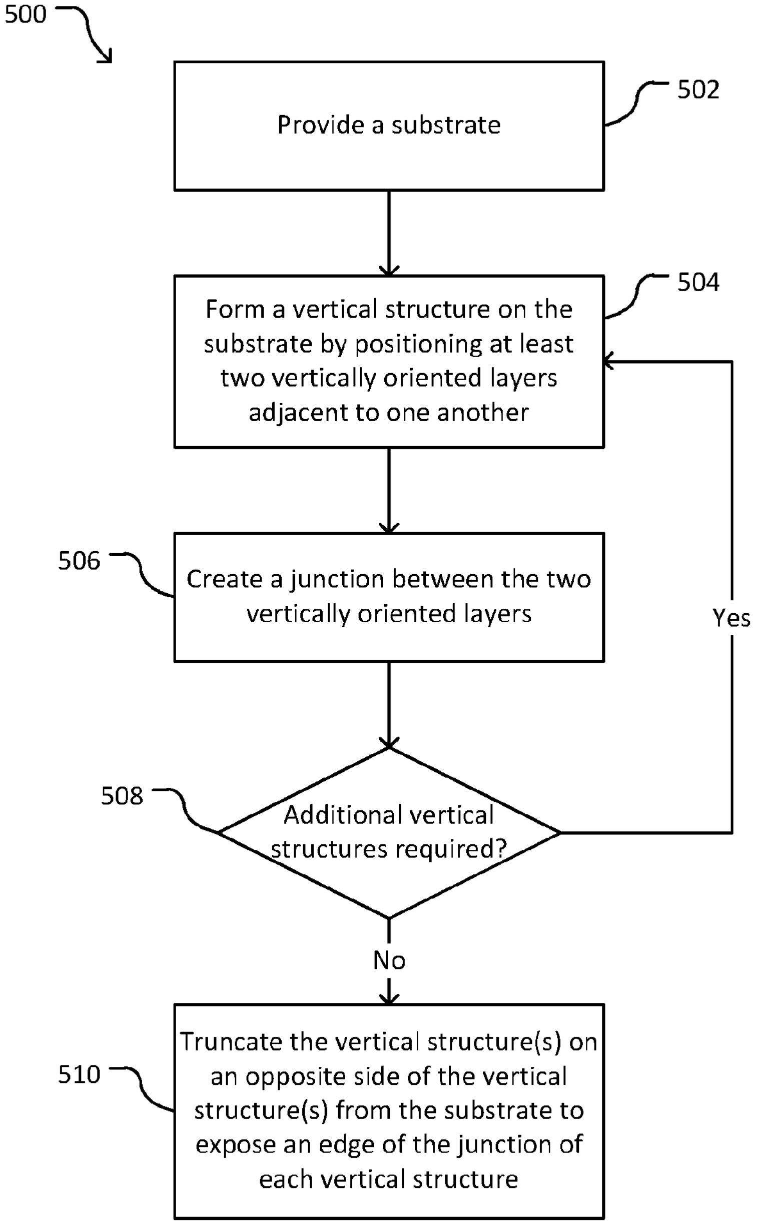
FIG. 5 is a flowchart of a process for creating a VEJFE structure, according to one embodiment.

Referring to FIG. 5, a flow diagram of a process 500 for fabricating a VEJFE structure is shown, according to one embodiment. The process 500 may include use of the components and materials discussed herein in regards to FIG. 4. In alternative embodiments, fewer, additional, and/or different actions may be performed. Also, the use of a flow diagram is not meant to be limiting with respect to the order of actions performed. At 502, a substrate is provided. At 504-508, one or more vertical structures is formed on the substrate. Each vertical structure is formed by positioning at least two vertically oriented layers adjacent to one another. In various embodiments, the vertically oriented layers can be provided as a conducting layer, a semiconductor layer, and/or an insulating layer. Layers may be formed individually for each vertical structure, or may be formed by deposited a coating on a plurality of vertical structures. In one embodiment at least one of the vertical structures is in the shape of a cone. In another embodiment at least one of the vertical structures is in the shape of a pyramid. In another embodiment at least one of the vertical structures is in the shape of a cylinder. The vertical structures may be arranged in an array/grid pattern.

At 506, a junction is created between two vertically oriented layers. A 2DEG is produced at the junction. At 508, a determination is made as to whether additional vertical structures are required. If additional vertical structures are required, then the steps 504-506 may be repeated as necessary. If additional vertical structures are not required, then at 510, the vertical structures are truncated on an opposite side of the vertical structures to expose an edge of the junction of each vertical structure. In some embodiments, vertical structures are individually truncated before additional vertical structures are provided. As such, the tops of one or more vertical structures are removed to expose each edge of each junction of each vertical structure. For example, the tops of the vertical structures may be polished, ground, or otherwise machined to expose the edges. In some embodiments, an electrode structure is provided as an anode or electrode grid and arranged over the tops of the vertical structures, and the anode or electrode grid is configured to control the emission of electrons from the exposed edges of the structures. In some embodiments, an electrode structure is formed as part of one or more individual vertical structures.

The construction and arrangement of the systems and methods as shown in the various embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the embodiments without departing from the scope of the present disclosure.

The present disclosure contemplates methods, systems and program products on any machine-readable media for accomplishing various operations. The embodiments of the present disclosure may be implemented or modeled using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a specific order of method steps, the order of the steps may differ from what is depicted. Also two or more steps may be performed concurrently or with partial concurrence. All such variations are within the scope of the disclosure. Likewise, software implementations could be accomplished with standard programming techniques with rule-based logic and other logic to accomplish the various connection steps, processing steps, comparison steps and decision steps.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

What is claimed is:

1. A method of fabricating a HMJFE structure, comprising:

disposing a first multilayer structure on a first substrate including a first surface, the first multilayer structure being configured to produce a first 2DEG at a junction between two layers within the first multilayer structure;

disposing a first isolation layer on the first multilayer structure;

disposing a second multilayer structure on the first isolation layer, the second multilayer structure configured to produce a second 2DEG at a junction between two layers within the second multilayer structure; and disposing a first anode on the first surface of the first substrate, the first anode configured to collect electrons emitted by the first 2DEG.

2. The method of claim 1, further comprising:

disposing a third multilayer structure on the first surface of the first substrate, the third multilayer structure being configured to produce a third 2DEG at a junction between two layers within the third multilayer structure;

disposing a second isolation layer on the third multilayer structure; and disposing a fourth multilayer structure on the second isolation layer, the fourth multilayer structure configured to produce a fourth 2DEG at a junction between two layers within the fourth multilayer structure.

3. The method of claim 2, wherein a first anode surface of the anode is oriented to face the first multilayer structure and the second multilayer structure to collect electrons emitted by the first 2DEG and the second 2DEG, and a second anode surface of the anode is oriented to face the third multilayer structure and the fourth multilayer structure to collect electrons emitted by the third 2DEG and the fourth 2DEG.

4. The method of claim 3, wherein an exposed surface of at least one of the first multilayer structure or the third multilayer structure is positioned oblique to the first surface of the first substrate.

5. The method of claim 2, wherein the first anode is attached to a second substrate spaced apart from the first substrate.

6. The method of claim 2, further comprising disposing an insulator adjacent to an opposite side of the first anode from the first multilayer structure and adjacent to the third multilayer structure.

7. The method of claim 6, further comprising disposing a second anode on the first surface of the first substrate, the second anode configured to collect electrons emitted by the third 2DEG.

8. A method of fabricating a VEJFE structure, comprising:

forming a plurality of vertical structures on a substrate, wherein forming each vertical structure includes positioning at least two vertically oriented layers adjacent to one another to create a junction between the two vertically oriented layers; and truncating the plurality of vertical structures on an opposite side of the plurality of vertical structures from the substrate to expose an edge of the junction, the junction configured to produce a 2-dimensional electron gas (2DEG).

9. The method of claim 8, wherein each vertical structure comprises a cone.

10. The method of claim 8, wherein each vertical structure comprises a pyramid.

11. The method of claim 8, wherein each vertical structure comprises a cylinder.

12. The method of claim 8, further comprising polishing the plurality of vertical structures to expose the junction edge.

13. The method of claim 8, further comprising etching the plurality of vertical structures to expose the junction edge.

14. The method of claim 8, further comprising arranging an electrode structure above the exposed junction edge of each vertical structure.

15. The method of claim 14, wherein the electrode structure comprises an anode configured to collect electrons emitted by each 2DEG out of the exposed junction edges.

16. The method of claim 14, wherein the electrode structure comprises a control grid configured to control an electric field between the vertical structures and the control grid.

17. The method of claim 14, wherein the electrode structure comprises a continuous planar structure.

18. The method of claim 14, wherein the electrode structure comprises a planar array of apertures.

19. The method of claim 14, wherein the electrode structure comprises a single electrode structure for the plurality of vertical structures.

20. The method of claim 14, wherein the electrode structure comprises a plurality of electrically-separate electrode assemblies.

21. The method of claim 8, further comprising including an electrode structure in at least one vertical structure.

22. The method of claim 21, wherein the electrode structure includes an anode configured to collect electrons emitted by the 2DEG of the at least one vertical structure.

23. The method of claim 21, wherein the electrode structure includes a control grid configured to control an electric field between the at least one vertical structure and the control grid.

24. The method of claim 23, further comprising truncating the control grid in the same plane as the edge of the 2DEG of the at least one vertical structure.

25. The method of claim 23, further comprising disposing a biasing layer in the substrate and coupling the electrode structure to the biasing layer to allow for a bias to be applied between the electrode structure and the 2DEG.

* * * * *